(12) United States Patent
Camp et al.

(10) Patent No.: US 9,639,462 B2
(45) Date of Patent: May 2, 2017

(54) DEVICE FOR SELECTING A LEVEL FOR AT LEAST ONE READ VOLTAGE

(71) Applicant: INTERNATIONAL BUSINESS MACHINES CORPORATION, Armonk, NY (US)

(72) Inventors: Charles J. Camp, Sugar Land, TX (US); Evangelos S Eleftheriou, Rueschlikon (CH); Thomas Mittelholzer, Zurich (CH); Thomas Parnell, Zurich (CH); Nikolaos Papandreou, Thalwil (CH); Charalampos Pozidis, Thalwil (CH); Andrew Walls, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 162 days.

(21) Appl. No.: 14/568,178

(22) Filed: Dec. 12, 2014

(65) Prior Publication Data

US 2015/0169468 A1 Jun. 18, 2015

(30) Foreign Application Priority Data

Dec. 13, 2013 (GB) .................................. 1322075.1

(51) Int. Cl.
*G06F 12/10* (2016.01)
*G06F 12/02* (2006.01)
*G11C 11/56* (2006.01)

(52) U.S. Cl.
CPC .......... *G06F 12/0246* (2013.01); *G11C 11/56* (2013.01); *G11C 11/5642* (2013.01); *G11C 11/5678* (2013.01); *G11C 11/5685* (2013.01)

(58) Field of Classification Search
CPC ........... G06F 12/1027; G06F 2212/681; G06F 17/217; G06F 17/30011; G06F 17/3002;
(Continued)

(56) References Cited

U.S. PATENT DOCUMENTS 5,490,110 A 2/1996 Sawada et al.
5,559,956 A 9/1996 Sukegawa
(Continued)

FOREIGN PATENT DOCUMENTS

CN 101325089 A 12/2008
EP 1008936 A2 6/2000
(Continued)

OTHER PUBLICATIONS

Robert Frickey, Data Integrity on 20nm SSDs, Flash Memory Summit 2012, 2012, Santa Clara, CA, Website: http://www.flashmemorysummit.com/English/Collaterals/Proceedings/2012/20120821_TC12_Frickey.pdf.
(Continued)

*Primary Examiner* — Tuan Thai
*Assistant Examiner* — Edward Waddy, Jr.
(74) *Attorney, Agent, or Firm* — Mercedes Hobson

(57) ABSTRACT

Device for selecting a level for at least one read voltage for reading data stored in a multi-level memory device. The multi-level memory device includes a plurality of memory blocks, in which each of the memory blocks includes a plurality of word lines, each of the word lines being allocated to a plurality of memory pages and being indexed by a word line index. The device includes a first mapping unit for mapping each of the word line indices to one bin label, in which the number of bin labels is smaller than the number of word lines, and a second mapping unit for mapping each of the bin labels to a voltage information being indicative for at least one read voltage, in which the level for the at least
(Continued)

one read voltage for reading data is selectable for each word line based on the respective word line index.

20 Claims, 4 Drawing Sheets

(58) Field of Classification Search
CPC ......... G06F 17/30091; G06F 17/30094; G06F 17/30613
USPC ........ 711/170, 207, E12.001, 108, 112, 141, 711/154, 156; 712/E9.02, E9.033, 220
See application file for complete search history.

(56) References Cited

U.S. PATENT DOCUMENTS

| | | |
|---|---|---|
| 5,673,383 A | 9/1997 | Sukegawa |
| 5,905,993 A | 5/1999 | Shinohara |
| 6,259,627 B1 | 7/2001 | Wong |
| 6,553,104 B1 | 4/2003 | Haefliger |
| 6,996,692 B2 | 2/2006 | Kouno |
| 7,424,666 B2 | 9/2008 | Chandwani et al. |
| 7,542,344 B2 | 6/2009 | Kim |
| 7,545,677 B2 | 6/2009 | Lee et al. |
| 7,649,782 B2 | 1/2010 | Eguchi et al. |
| 7,808,836 B2 | 10/2010 | Murin et al. |
| 7,986,560 B2 | 7/2011 | Park et al. |
| 8,116,141 B2 | 2/2012 | Yoo et al. |
| 8,281,220 B2 | 10/2012 | Kitahara |
| 8,296,620 B2 | 10/2012 | Chen et al. |
| 8,356,216 B2 | 1/2013 | Radke et al. |
| 8,463,983 B2 | 6/2013 | Eleftheriou et al. |
| 8,527,819 B2 | 9/2013 | Shalvi et al. |
| 8,555,109 B2 | 10/2013 | Dhuse et al. |
| 8,687,421 B2 | 4/2014 | Avila et al. |
| 8,938,659 B2 | 1/2015 | Wu et al. |
| 9,075,705 B2 | 7/2015 | Hikichi |
| 2004/0083335 A1 | 4/2004 | Gonzalez et al. |
| 2005/0093571 A1 | 5/2005 | Suaris et al. |
| 2007/0180328 A1 | 8/2007 | Cornwell et al. |
| 2008/0123419 A1 | 5/2008 | Brandman et al. |
| 2008/0192544 A1 | 8/2008 | Berman et al. |
| 2009/0003073 A1 | 1/2009 | Rizel et al. |
| 2009/0070654 A1 | 3/2009 | Flachs et al. |
| 2009/0141563 A1 | 6/2009 | Furnemont |
| 2009/0323412 A1 | 12/2009 | Mokhlesi et al. |
| 2009/0323423 A1 | 12/2009 | Bloom et al. |
| 2010/0064096 A1 | 3/2010 | Weingarten et al. |
| 2010/0257429 A1 | 10/2010 | Noguchi |
| 2011/0041039 A1 | 2/2011 | Harari et al. |
| 2011/0238890 A1 | 9/2011 | Sukegawa |
| 2012/0047409 A1 | 2/2012 | Post et al. |
| 2012/0066441 A1 | 3/2012 | Weingarten |
| 2012/0198128 A1 | 8/2012 | Van Aken |
| 2012/0216085 A1 | 8/2012 | Weingarten et al. |
| 2012/0226963 A1 | 9/2012 | Bivens et al. |
| 2012/0239858 A1 | 9/2012 | Melik-Martirosian |
| 2012/0239991 A1* | 9/2012 | Melik-Martirosian ........ G06F 11/3034 714/708 |
| 2012/0246540 A1 | 9/2012 | Lee et al. |
| 2012/0250415 A1 | 10/2012 | Sharon et al. |
| 2012/0284587 A1 | 11/2012 | Yu et al. |
| 2012/0304039 A1 | 11/2012 | Peterson et al. |
| 2012/0311271 A1 | 12/2012 | Klein et al. |
| 2012/0324299 A1 | 12/2012 | Moshayedi |
| 2012/0331207 A1 | 12/2012 | Lassa et al. |
| 2013/0073786 A1 | 3/2013 | Belgal et al. |
| 2013/0094286 A1 | 4/2013 | Sridharan et al. |
| 2013/0111298 A1 | 5/2013 | Seroff et al. |
| 2013/0124787 A1 | 5/2013 | Schuette |
| 2013/0124931 A1 | 5/2013 | Chen |
| 2013/0145079 A1 | 6/2013 | Lee et al. |
| 2013/0166827 A1 | 6/2013 | Cideciyan et al. |
| 2013/0194865 A1 | 8/2013 | Bandic et al. |
| 2013/0215682 A1 | 8/2013 | Yang |
| 2013/0227200 A1* | 8/2013 | Cometti ............. G06F 12/0246 711/103 |
| 2013/0297988 A1 | 11/2013 | Wu et al. |
| 2013/0339574 A1 | 12/2013 | Franceschini et al. |
| 2014/0006694 A1 | 1/2014 | Seo et al. |
| 2014/0040664 A1 | 2/2014 | Hida et al. |
| 2014/0040681 A1 | 2/2014 | Wolfman et al. |
| 2014/0059405 A1 | 2/2014 | Syu et al. |
| 2014/0082440 A1 | 3/2014 | Ho et al. |
| 2014/0089564 A1 | 3/2014 | Liu et al. |
| 2014/0095110 A1* | 4/2014 | Chen ................... G11C 29/028 702/179 |
| 2014/0101490 A1 | 4/2014 | Cronin et al. |
| 2014/0126292 A1 | 5/2014 | Yang et al. |
| 2014/0208004 A1 | 7/2014 | Cohen et al. |
| 2014/0208041 A1 | 7/2014 | Hyde et al. |
| 2014/0334228 A1 | 11/2014 | Kim et al. |
| 2015/0103593 A1 | 4/2015 | Su |
| 2015/0154061 A1 | 6/2015 | Camp et al. |
| 2015/0161034 A1 | 6/2015 | Fisher |
| 2015/0161035 A1 | 6/2015 | Fisher et al. |
| 2015/0161036 A1 | 6/2015 | Camp et al. |
| 2015/0170746 A1 | 6/2015 | Oowada et al. |
| 2015/0177995 A1 | 6/2015 | Camp et al. |
| 2015/0243363 A1 | 8/2015 | Wu et al. |
| 2015/0262712 A1 | 9/2015 | Chen et al. |
| 2016/0110248 A1 | 4/2016 | Camp et al. |
| 2016/0179412 A1 | 6/2016 | Camp et al. |
| 2016/0179664 A1 | 6/2016 | Camp et al. |

FOREIGN PATENT DOCUMENTS

| | | |
|---|---|---|
| JP | H05282880 A | 10/1993 |
| JP | 5203049 B2 | 6/2013 |
| KR | 20130088061 A | 8/2013 |
| WO | 2009072100 A2 | 6/2009 |
| WO | WO-2009/114618 A2 | 9/2009 |

OTHER PUBLICATIONS

Yu Cai et al., Threshold Voltage Distribution in MLC NAND Flash Memory: Characterization, Analysis, and Modeling, Proceedings of the Design, Automation, and Test in Europe Conference, Mar. 18-22, 2013, Grenoble, France.

H.-S. Phillip Wong et al., Phase Change Memory, Proceedings of the IEEE, Dec. 2010, pp. 2201-2227, vol. 98—Issue 12.

Guiqiang Dong et al., Using Lifetime-Aware Progressive Programming to Improve SLC NAND Flash Memory Write Endurance, IEEE Transactions on Very Large Scale Integration (VLSI) Systems, Jul. 3, 2013, pp. 1270-1280, vol. 22—Issue 6.

Bruno Ricco et al., Nonvolatile Multilevel Memories for Digital Applications, Proceedings of the IEEE, Dec. 1998, pp. 2399-2423, vol. 86—Issue 12.

Wei-Chih Chien et al., A Multi-Level 40nm WOx Resistive Memory with Excellent Reliability, Electron Devices Meeting (IEDM) 2011 IEEE International, Dec. 5-7, 2011, pp. 31.5.1-31.5.4, IEEE, Washington DC.

Anonymous, "Method of combined data retention and wear leveling scan for minimizing flash resource contention in flash based memory systems," IP.com Electronic Publication, Aug. 10, 2013, pp. 1-3.

Chang et al., "Endurance Enhancement of Flash-Memory Storage Systems: An Efcient Static Wear Leveling Design," 44th ACM/IEEE Design Automation Conference, Jun. 4-8, 2007, pp. 212-217.

Chang et al., "A Low-Cost Wear-Leveling Algorithm for Block-Mapping Solid-State Disks," ACM SIGPLAN/SIGBED Conference on Languages, Compilers, Tools and Theory for Embedded Systems, Apr. 11-14, 2011, pp. 31-40.

Chang, Li-Pin, "On Efficient Wear Leveling for Large-Scale Flash-Memory Storage Systems," Proceedings of the 2007 ACM symposium on Applied computing, Mar. 11-15, 2007, 5 pages.

Chen et al., "Bias-induced oxygen adsorption in zinc tin oxide thin film transistors under dynamic stress," Applied Physics Letters 96, No. 26, Jun. 2010, pp. 262104-1-262104-3.

(56) References Cited

OTHER PUBLICATIONS

Cho et al., "NAND Reliability Improvement with Controller Assisted Algorithms in SSD," Flash Memory Summit, Santa Clara, CA, Aug. 2013, pp. 1-18.
Choi et al., "Wear Leveling for PCM Using Hot Data Identification." Proceedings of the International Conference on IT Convergence and Security 2011, Dec. 7, 2011.
Gregori et al., "On-Chip Error Correcting Techniques for New-Generation Flash Memories," Proceedings of the IEEE, vol. 91, Issue 4, Apr. 2003, pp. 602-616.
Grupp et al., "Characterizing Flash Memory: Anomalies, Observations, and Applications," IEEE/ACM International Symposium on Microarchitecture, Dec. 12-16, 2009, 10 pages.
Hsieh et al., "Efficient Identification of Hot Data for Flash Memory Storage Systems," ACM Transactions on Storage, vol. 2, No. 1, Feb. 2006, pp. 22-40.
Hu et al., "Container Marking: Combining Data Placement, Garbage Collection and Wear Levelling for Flash," IEEE, Jul. 25-27, 2011, pp. 237-247.
Huang et al., "An Aggressive Worn-out Flash Block Management Scheme to Alleviate SSD Performance Degradation," Eurosys'14, Apr. 14-16, 2014, 14 pages.
Hutsell et al., "Flash Solid-State Disk Reliability," Texas Memory Systems, Nov. 2008, pp. 1-16.
Hutsell, W., "An In-depth Look at the RamSan-500 Cached Flash Solid State Disk," Texas Memory Systems, Mar. 2008, pp. 1-14.
Hutsell, W., "An In-depth Look at the RamSan-620 Flash Solid State Disk," Texas Memory Systems, Jul. 2009, pp. 1-16.
Jung et al., "A Group-Based Wear-Leveling Algorithm for Large-Capacity Flash Memory Storage Systems," Proceedings of the 2007 International Conference on Compilers, architecture, and synthesis for embedded systems, Sep. 30-Oct. 3, 2007, pp. 160-164.
Micheloni et al., "Non-volatile memories for removable media," Proceedings of the IEEE, vol. 97, No. 1, Jan. 2009, pp. 148-160.
Prince, B., "After DRAM—Some Novel Contenders," Emerging Memories: Technologies and Trends, Feb. 28, 2002, pp. 181-233.
Qureshi et al., "Enhancing Lifetime and Security of PCM-Based Main Memory with Start-Gap Wear Leveling," 42nd Annual IEEE/ACM International Symposium on Microarchitecture, Dec. 12-16, 2009, pp. 14-23.
Schmidt et al., "Heavy Ion SEE Studies on 4-Gbit NAND-Flash Memories," IEEE, Sep. 10-14, 2007, pp. 1-4.
Silverton Consulting, Inc., "IBM FlashSystem 840 RAS for better performance and data protection," StorInt Briefling, Jun. 2012, pp. 1-7.

\* cited by examiner

| PEC | BIN1 | BIN2 | BIN3 | BIN4 | BIN5 |
|---|---|---|---|---|---|
| 1K | $V_{1,1}$ | $V_{1,2}$ | $V_{1,3}$ | $V_{1,4}$ | $V_{1,5}$ |
| 2K | $V_{2,1}$ | $V_{2,2}$ | $V_{2,3}$ | $V_{2,4}$ | $V_{2,5}$ |
| ... | ... | ... | ... | ... | ... |
| 11K | $V_{11,1}$ | $V_{11,2}$ | $V_{11,3}$ | $V_{11,4}$ | $V_{11,5}$ |

DEVICE FOR SELECTING A LEVEL FOR AT LEAST ONE READ VOLTAGE

This application claims priority under 35 U.S.C. §119 from United Kingdom Patent Application No. 1322075.1 filed Dec. 13, 2013, the entire contents of which are incorporated herein by reference.

BACKGROUND OF THE INVENTION

Field of the Invention

The invention relates to a device for selecting a level for at least one read voltage for reading data stored in a multi-level memory device, a memory system including a multi-level memory device, and a device. Further, the invention relates to a method for selecting a level for at least one read voltage for reading data stored in a multi-level memory device and to a computer program for executing such a method. More specifically, the multi-level memory device includes multi-level cells (MLC) having a plurality of programmable levels.

Background

A prominent example for MLC memory cells having a plurality of programmable levels is Resistive Random Access Memory (RRAM; see A Multi-Level 40 nm WOx Resistive Memory with Excellent Reliability by Wei-Chih Chien et al.), Phase Change Memory (PCM; see Phase Change Memory by H.-S. Phillip Wong et al.), or Flash (see Nonvolatile Multilevel Memories for Digital Applications by Bruno Ricco et al.). PCM is a non-volatile solid-state memory technology that exploits a reversible, thermally-assisted switching of specific chalcogenides between certain states of different electrical conductivity.

A multi-level memory device typically includes a plurality of memory blocks. Each memory block includes a plurality of word lines. The word lines include each a plurality of memory cells within which one or more pages are interleaved. In order to read data stored in the pages, a number of read voltages are applied to the word lines. In order to extend the endurance of the memory cells, the read voltage should be kept at an optimal level. In principle, the criterion used to determine the optimal levels can vary. For instance, the optimal read voltages can be defined to be those voltages that minimize the raw bit error rate at the output of the multi-level memory device. Over the course of the lifetime of the memory cells, the optimal read voltage levels change.

In common systems, a static table of read voltage levels is used to choose a read voltage level. The stored read voltage levels are indexed by a program/erase (P/E) cycle count. The P/E cycle count refers to the number of program or erase operations per memory block. The table entries can consist of a triplet of voltages, i.e. one voltage for the lower page of the memory block and two for the upper page of the memory block, which is equivalent to the read voltages for the allocated word lines.

A fixed granularity of cycle counts is needed, for instance the voltage levels change every thousand cycles. The voltage levels stored in the table are chosen to maximize endurance and are determined offline by characterization of the multi-level memory device. As part of a page's meta-data, the number of P/E cycles it has been subjected to can be stored. This meta-data information is commonly stored in DRAM on the memory controller. In this case, to read a page one must retrieve the P/E cycle count from DRAM and then look up the read voltage levels from the table.

In the common systems, the same read voltage levels are used for all pages only depending on the number of P/E cycles.

Conventional methods and techniques using the above approach are described, for example, in US 2012/0239858 A1, U.S. Pat. Nos. 7,986,560 B2, 7,649,782 B2, 8,116,141 B2, US 2013/0145079 A1, and US 2013/0215682 A1 or in Threshold Voltage Distribution in MLC NAND Flash Memory: Characterization, Analysis, and Modeling by Cai et al and Using Lifetime-Aware Progressive Programming to Improve SLC NAND Flash Memory Write Endurance by Dong et al.

Accordingly, the present invention provides an improved device for selecting a read voltage level for reading data stored in a multi-level memory device.

SUMMARY OF THE INVENTION

Accordingly, one aspect of the present invention provides a device for selecting a level for at least one read voltage for reading data stored in a multi-level memory device, in which the multi-level memory device includes a plurality of memory blocks, in which wherein each of the plurality of memory blocks includes a plurality of word lines; and in which each of the word lines is allocated to a plurality of memory pages and is indexed by a word line index, the device including: a first mapping unit for mapping each of the word line indices to one bin label, wherein the number of bin labels is smaller than the number of word lines; and a second mapping unit for mapping each of the bin labels to a voltage information being indicative for at least one read voltage, wherein the level for the at least one read voltage for reading data is selectable for each word line based on the respective word line index.

Another aspect of the present invention provides a memory system, including: a multi-level memory device including a plurality of memory chips for storing data; and a device for selecting a level for at least one read voltage for reading data stored on the multi-level memory device, wherein the device includes: a first mapping unit for mapping each of a word line indices to one bin label, wherein the number of bin labels is smaller than the number of word lines; and a second mapping unit for mapping each of the bin labels to a voltage information being indicative for at least one read voltage, wherein the level for the at least one read voltage for reading data is selectable for each of the word lines based on a respective word line index.

Another aspect of the present invention provides a method for selecting a level for at least one read voltage for reading data stored in a multi-level memory device, the multi-level memory device including: a plurality of memory blocks, in which each of the memory blocks includes a plurality of word lines and each of the word lines is allocated to a plurality of memory pages and is indexed by a word line index, the method including: mapping each of the word line indices (WLI) to one bin label (BINL), wherein the number of bin labels (BINL) is smaller than the number of word lines, and mapping each of the bin labels (BINL) to a voltage information (VI) being indicative for at least one read voltage (RV), wherein the level for the at least one read voltage (RV) for reading data is selectable for each word line based on the respective word line index (WLI).

Another aspect of the present invention provides a non-transitory computer readable storage medium tangibly embodying a computer readable program code having computer readable instructions which, when implemented, cause a computer device to carry out the steps of the method stated above.

In the following, exemplary embodiments of the present invention are described with reference to the enclosed figures.

BRIEF DESCRIPTION OF THE DRAWINGS

Similar or functionally similar elements in the figures have been allocated the same reference signs if not otherwise indicated.

DETAILED DESCRIPTION OF THE PREFERRED EMBODIMENT

Figures 1, 2:
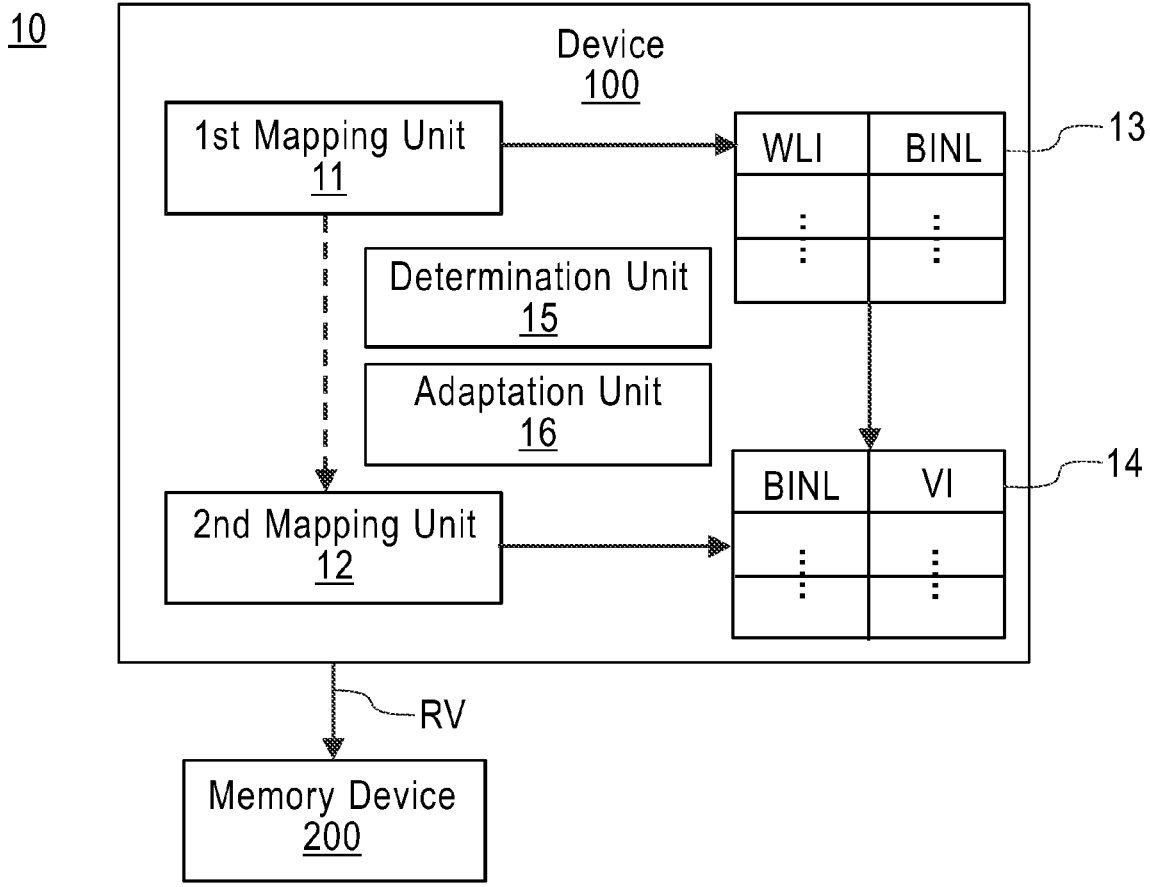
FIG. 1 shows a schematic block diagram of a first embodiment of a memory system including a device for selecting a level for at least one read voltage for reading data stored in a multi-level memory device.
FIG. 2 shows an embodiment of a look-up table of the second mapping unit of FIG. 1 storing voltage information.

According to an embodiment of a first aspect, a device for selecting a level for at least one read voltage for reading data stored in a multi-level memory device is provided. The multi-level memory device includes a plurality of memory blocks, wherein each of the memory blocks includes a plurality of word lines, each of the word lines being allocated to a plurality of memory pages and being indexed by a word line index. The device includes a first mapping unit for mapping each of the word line indices to one bin label, wherein the number of bin labels is smaller than the number of word lines, and a second mapping unit for mapping each of the bin labels to a voltage information being indicative for at least one read voltage, wherein the level for the at least one read voltage for reading data is selectable for each word line based on the respective word line index.

The embodiments of the preset invention improve the selection of an optimal read voltage by grouping word lines, i.e. pages, together which have a similar characteristic. Thus, the selection is not based solely on the number of program/erase cycle counts, but on a determination of a characteristic of the different pages within one memory block and a corresponding grouping of the pages, or the word lines which are allocated to the pages into bins.

According to embodiments, the level for at least one read voltage for reading data stored in the memory device which is a multi-level memory device (MLC), for instance a three-level memory device (TLC), can be selected based on the word line index. The word line index is mapped, by the first mapping unit, to a bin label in which word lines and thus pages having a similar or equal characteristic can be grouped together. Each bin label is mapped, by the second mapping unit, to a voltage information.

According to some implementations, the bin label can be changed due to a change of the characteristic of the word lines. In each bin label, word lines (and thus pages) can e.g. be grouped together having the same or at least a similar optimal read voltage level. The voltage information being obtainable from the second mapping unit can include any kind of information being adapted to indicate the read voltage to be used. The voltage information can represent one or more read voltage levels, depending on the number of read voltage levels being required.

According to some implementations, the number of word line indices N is an integer greater than or equal to 1 ($N \geq 1$), the number of pages M is an integer greater than or equal to 1 ($M \geq 1$). The number of bin labels L is an integer greater than or equal to 2 ($L \geq 2$).

According to an embodiment of the present invention, the second mapping unit includes a look-up table, in which a plurality of bin labels is allocated to a plurality of voltage information. According to this embodiment, each bin label is allocated to more than one voltage information. For instance, each bin label is allocated to a triplet of voltage information being indicative for a triplet of read voltage levels.

According to a further embodiment of the present invention, the voltage information includes at least one read voltage value or a delta value for increasing or decreasing an actual read voltage value. According to this embodiment, the voltage information can either directly indicate at least one read voltage value or can indicate a delta value. The delta value can be used to increase or decrease an actual read voltage value. Storing only a delta value can reduce the required storage.

According to a further embodiment of the present invention, the first mapping unit includes a look-up table, in which a plurality of bin labels is allocated to a plurality of word line indices.

The look-up table can be updated during operation of the memory device as the characteristic of the word lines, i.e. the corresponding pages, changes over the lifetime and thus, a new mapping might be needed. At the beginning, all word line indices can be mapped to the same bin label, which can be an average bin.

According to a further embodiment of the present invention, the first mapping unit is adapted to map a plurality of word line indices to the same bin label.

As the characteristics of some word lines can be similar or equal, the word line indices of these word lines are mapped to the same bin label. The grouping or mapping can change over the lifetime of the memory device as the characteristics of the word lines and the corresponding pages can vary in different ways, i.e. some word lines are grouped together at the beginning and other word lines are grouped together during the operation, i.e. lifetime, of the memory device.

According to a further embodiment of the present invention, meta-data for each word line includes information indicative for an actual cycle count.

The actual cycle count corresponds to the program and erase cycles (P/E cycles) performed for each word line, i.e. for the whole memory block. The meta-data which is stored in a controller of the memory can be read before each reading operation and the optimal read voltage level can be chosen accordingly. According to some implementations, the bin label for each word line index is updated in predefined intervals, wherein the intervals depend on the actual cycle count. For instance, the mapping between bin label and word line index can be updated every thousandth P/E cycles.

According to a further embodiment of the present invention, the second mapping unit includes a look-up table in which the voltage information is further mapped to a plurality of cycle counts. According to this embodiment, the voltage information is determined based on a combination of the cycle counts and the actual bin label. Thus, the look-up table can include a plurality of voltage information being indexed by row (cycle count) and column (bin). The voltage information can be determined offline, i.e. before operation of the memory device.

According to a further embodiment of the present invention, the device includes a determination unit for determining an actual bit error rate when reading a word line, for comparing the determined actual bit error rate with a threshold and for selecting the bin label based on the result of the comparison. According to this embodiment, a health check can be performed in order to determine whether the bin label needs to be changed or not. The optimal bin label, and thus the optimal read voltage, for each word line is defined as the bin label which minimizes the bit error rate (BER). The threshold can be defined as a 3-sigma positive deviation from the mean BER for word lines (or pages) in the k-th bin label subjected to j P/E cycles. Using this definition, a low latency can be achieved.

According to a further embodiment of the present invention, the determination unit is adapted to increase the bin label if the determined actual bit error rate is above the threshold, and to maintain the bin label if the determined actual bit error rate is equal to or below the threshold.

As the read voltage levels tend to shift upwards during cycling, the bin labels can be arranged such that an increasing health index, which corresponds to an increasing bin label, results in new threshold of an increased voltage. Thus, the determination of the bin label should converge quickly to the optimal bin label.

The voltage information can correspond to three different voltages for the three pages per word line. Note that the shift of these voltages during the lifetime of the memory device can vary differently so that the mapping between voltage level and bin label can performed independently for each read voltage, i.e. page.

For instance, the lower page can be read using read voltage VB. For each bin label, a delta value $+\Delta B$ can be stored. The upper page can be read using a read voltage pair VA and VC. For each bin label, $+\Delta A$ and $+\Delta C$ can be stored.

According to a further embodiment of the present invention, the determination unit is adapted to output a fail signal if the increased bin label is above a maximum number of bin labels.

When it is determined during the health check that the bin label should be increased but the actual bin label is already the highest bin label available, a fail signal can be output. In this case, the memory device can be detected as being beyond its lifetime cycle. Thus, it is not possible anymore to optimize the read voltage level and thus, the BER can be increased.

According to a further embodiment of the present invention, the device further includes an adaptation unit for determining a raw bit error when reading a word line with the corresponding voltage information and for adapting the corresponding voltage information based on the determined raw bit error.

The raw bit error, or bit error rate (BER), can be determined during a scrubbing process. Scrubbing refers to data scrubbing which is a data integrity technique which uses a background task that periodically reads from all pages in the device, performs error correction and then counts the number of raw bit errors that were corrected. During the scrubbing, the mapping of a word line index to a bin can be updated based on the raw bit error.

The BER can be improved by selecting the optimal delta values (or shifts) $\Delta A$, $\Delta B$, $\Delta C$ for the read voltage. The optimal read shifts can change due to cycling, data retention time and read disturb effects and can differ from block to block, even word line to word line. In one implementation, the voltage information is chosen to minimize the BER of the worst page or word line in the group.

The adaptation of the voltage information can be performed once a week. Also any other period is possible.

In some implementations, the voltage information being mapped to the bin label is changed. This means that only one voltage information is stored for each bin label which is updated.

According to a further embodiment of the present invention, the adaptation unit is configured, during the adaptation of the corresponding voltage information, to change the voltage information and to determine the raw bit error when using the changed voltage information.

In order to determine the optimal read voltage for a bin label, the stored data is read using the actual voltage information. The number of raw bit errors is then determined as reference value. Subsequently, the voltage information, and thus the read voltage, is slightly amended and the number of raw bit errors is determined and compared to the reference value. If read voltages are found that reduce the number of raw bit errors then this voltage information is then stored as new updated voltage information. The updated voltage information is used until the next scrubbing process and corresponding adaptation of the voltage information.

Any embodiment of the first aspect of the present invention can be combined with any embodiment of the first aspect to obtain another embodiment of the first aspect.

According to an embodiment of a second aspect of the present invention, a memory system is provided. The memory system includes a multi-level memory device having a plurality of memory chips for storing data. Further, the memory system includes a device of the first aspect for selecting a level for at least one read voltage for reading data stored on the multi-level memory device.

According to an embodiment of a third aspect of the present invention, a method for selecting a level for at least one read voltage for reading data stored in a multi-level memory device is provided. The multi-level memory device includes a plurality of memory blocks, wherein each of the memory blocks includes a plurality of word lines, each of the word lines being allocated to a plurality of memory pages and being indexed by a word line index. The method includes mapping each of the word line indices to one bin label, wherein the number of bin labels is smaller than the number of word lines, and mapping each of the bin labels to a voltage information being indicative for at least one read voltage, wherein the level for the at least one read voltage for reading data is selectable for each word line based on the respective word line index.

According to an embodiment of a fourth aspect of the present invention, the invention relates to a computer program including a program code for executing at least one step of the method of the third aspect for selecting a level for at least one read voltage for reading data stored on a multi-level memory device when run on at least one computer.

In general, where features are described herein with reference to an embodiment of one aspect of the present invention, corresponding features can be provided in embodiments of another aspect of the invention.

In FIG. 1, a schematic block diagram of a first embodiment of a memory system 10 including a device 100 for selecting a level for at least one read voltage RV for reading data stored in a multi-level memory device 200 is depicted.

The multi-level memory device 200 is adapted to store data in a plurality of memory blocks. Each of the memory blocks includes a plurality of word lines which are allocated to a plurality of memory pages.

In order to determine an optimal level for a read voltage RV, which is applied to a word line, the device 100 can be used. The device 100 includes a first mapping unit 11 and a second mapping unit 12. The first mapping unit 11, which includes a look-up table 13, maps indices WLI of the plurality of word lines to bin labels BINL. Thus, one or more word lines are grouped together by mapping the word line indices WLI to the same bin label BINL. The grouping can be based on a characteristic of the word lines, or the allocated pages, as is described with reference to FIG. 4.

Instead of being based on a look-up table 13, the first mapping unit 11 can be based on a static mapping implemented as a function of the word line indices WLI. In this case, the bin label BINL could assign groups of consecutive word lines to the same bin label BINL, e.g. BINL=Floor (WLI/8) would assign groups of 8 consecutive word lines to the same bin label BINL.

The second mapping unit 12 includes a look-up table 14. The second mapping unit 12 maps the bin labels BINL to voltage information VI as stored in the look-up table 14. The voltage information VI can be a delta value to be added to the actual read voltage RV or can be a voltage value. For example, the voltage information VI can include a triplet of voltage values wherein the first one is used for the lower page and the second and third value are used for the upper page.

The device 100 can then select the appropriate read voltage RV based on the word line and the corresponding word line index WLI.

The device 100 further includes a determination unit 15, which is described with reference to FIGS. 4 and 5, and an adaptation unit 16, which is described with reference to FIG. 6.

By using such a mapping between word line index WLI, bin label BINLI and voltage information VI, an optimal read voltage RV can be selected. Thus, for example the number of bit errors, which occur when using a wrong or at least not optimal read voltage RV, can be reduced. Also other optimality criteria can be used. As the word lines, and thus the corresponding pages, are grouped or binned into bins having bin labels depending on their characteristic, differences between the optimal read voltages RV for different pages can be taken into account.

In a further embodiment of the present invention as shown in FIG. 2, the look-up table 14 of the second mapping unit 12 includes also a mapping to an actual P/E cycle PEC, for instance 1000, 2000, 3000 . . . cycle count. Thus, when selecting a read voltage RV, the actual P/E cycle PEC and the bin label BINL, i.e. BIN1 to BIN5 in FIG. 2, are determined and then the actual read voltage RV, $V_{1,1}$ to $V_{11,5}$ in FIG. 2, can be selected.

Figure 3:
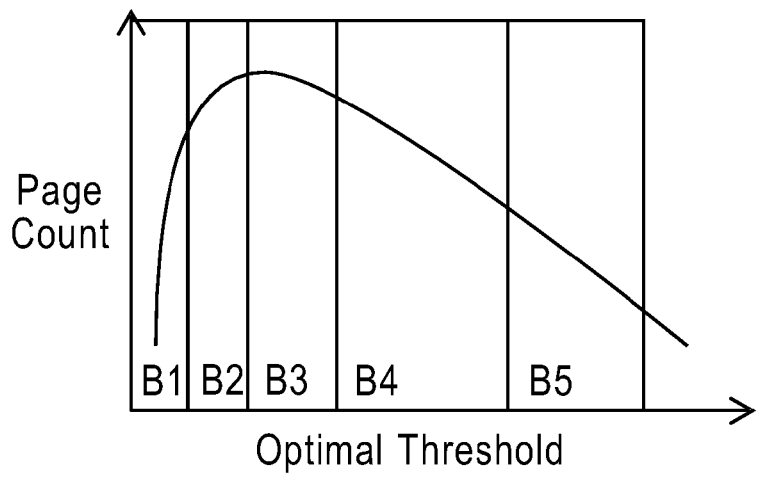
FIG. 3 shows a diagram illustrating grouping of pages according to an embodiment of the present invention.

BIN1 to BIN5 each includes memory pages, i.e. the memory pages or allocated word lines are mapped to BIN1 to BIN5, having a similar or equal optimal read levels. This can be seen in FIG. 3.

Figure 4:
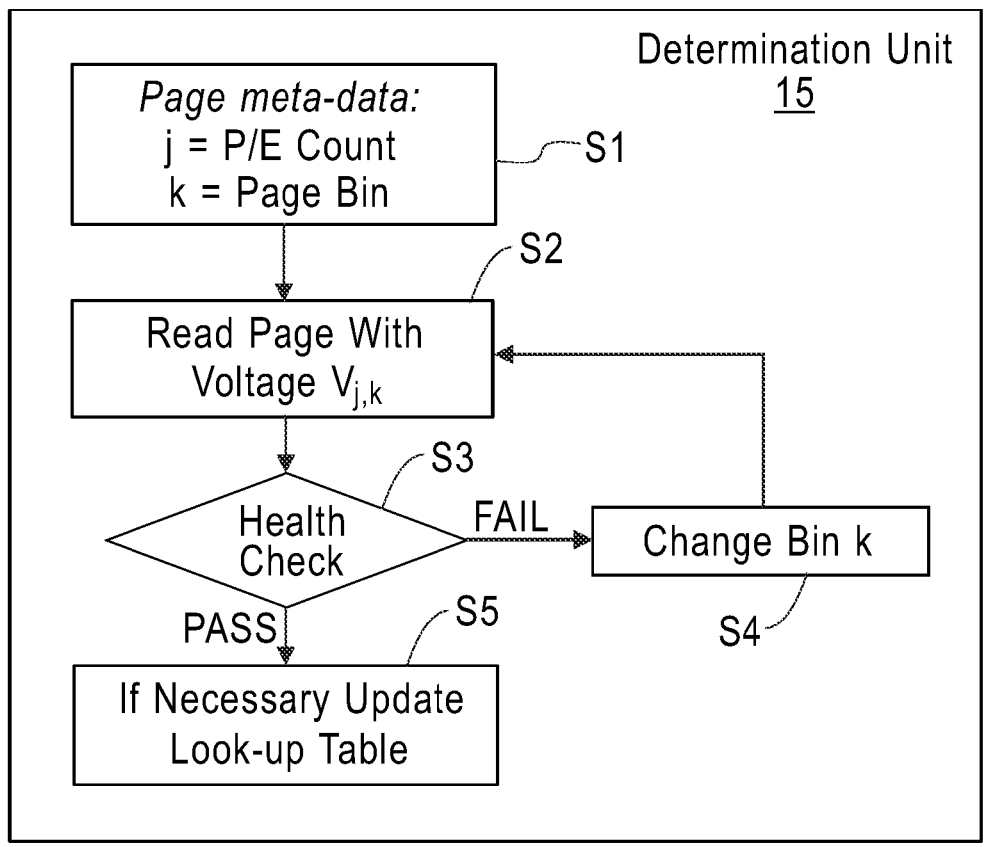
FIG. 4 shows a schematic block diagram of a first embodiment of a determination unit of the device of FIG. 1.

An embodiment of a determination unit 15 of the device 100, which is used to determine the actual characteristic and thus a corresponding bin label BINL, is shown in FIG. 4.

At the beginning of the lifetime of the memory device 200, all pages and allocated word lines are grouped into the same bin, for example bin label 3 BIN3. When reading data stored in the memory device 200, general page meta-data are determined in step S1 for determining the actual P/E cycle count. The actual page bin label BINL k is determined from the look-up table 13 of the first mapping unit 11.

Based on the look-up table 14, the read voltage $V_{j,k}$ is determined and the page is read using this read voltage $V_{j,k}$ in step S2. Subsequently, a health check is performed in step S3. When the health check fails, the bin label BINL k is changed in S4 and the page is read again using the new bin label BINL in step S2.

When the health check is passed, the look-up table 13 of the first mapping unit 11 is updated in step S5 if necessary. This can be the case if the bin label BINL has been changed in step S4.

Figure 5:
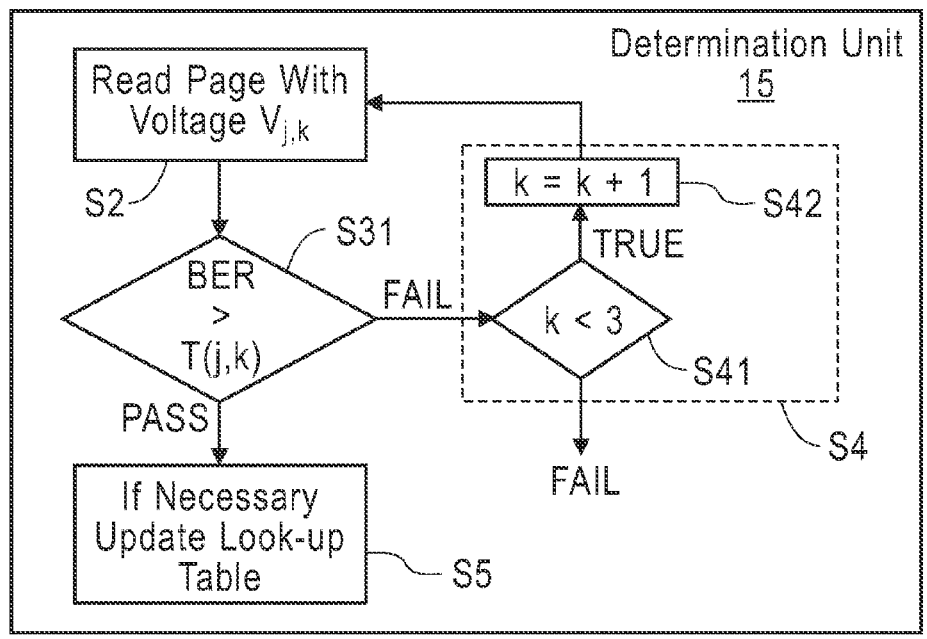
FIG. 5 shows a schematic block diagram of a first embodiment of a determination unit of the device of FIG. 1.

A further implementation for a determination unit 15 performing the health check is shown in FIG. 5. Here, the bit error rate BER when reading a page is determined and compared with a threshold T(j,k) in step S31. The threshold can be defined as a 3-sigma deviation from the mean BER for pages being in the same bin and P/E cycle count.

If the BER is below the threshold, the health check is passed. If the BER is above the threshold, the health check is failed. Then, it is determined in step S41 if the actual bin label BINLI k is below the maximum number of available bin labels BINL, in this case 3. If this is the case, the bin label BINL is increased, k=k+1, in step S42.

If the actual bin label BINL is already the maximum bin label BINL, the health check is also failed and a fail signal can be output.

Figure 6:
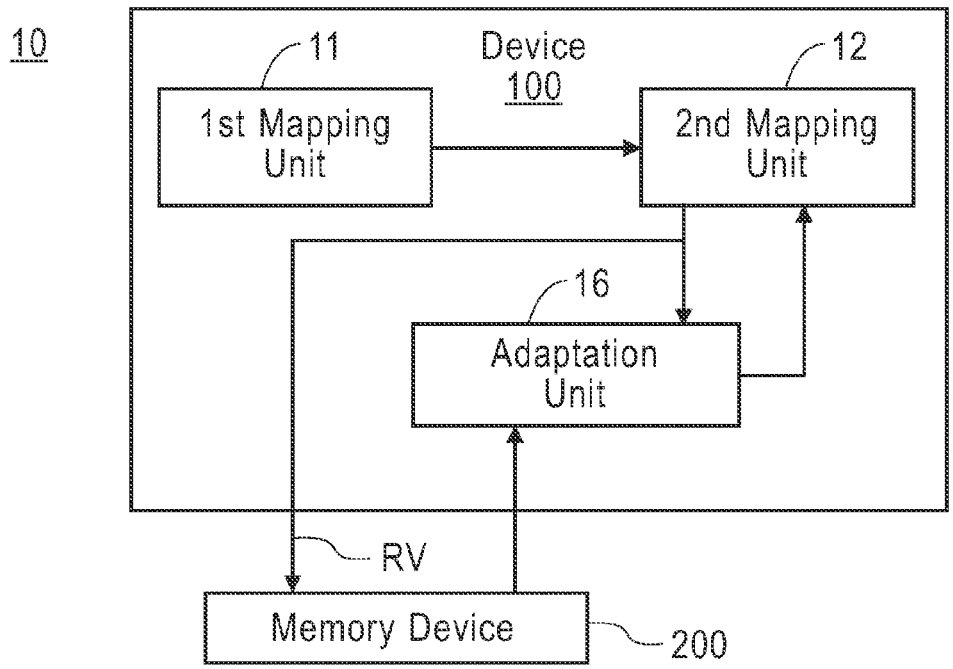
FIG. 6 shows a schematic block diagram of a second embodiment of a memory system including a device for selecting a level for at least one read voltage for reading data stored in a multi-level memory device.

In a further embodiment of the present invention, the device 100 includes an adaption unit 16 as shown in FIG. 6. According to this embodiment, the read voltage RV is optimized with a fixed frequency, for instance once per week, using the adaptation unit 16.

The optimization of the read voltage RV can be done for example during a data scrubbing process. The adaptation unit 16 adapts the voltage information VI within the second mapping unit 12 for all pages within the memory device 200.

The device 100 reads data from the memory device using the actual voltage information VI from the second mapping unit 12 as read voltage RV. The memory device 200 supplies the retrieved page containing bit errors. In order to calculate the number of raw bit errors, ECC decoding is performed inside the adaptation unit 16, and the number of errors that are corrected is counted. Thus, the number of raw bit errors BER is determined as reference value. The adaptation unit 16 slightly perturbs the voltage information in the second mapping unit 12, e.g. ±3, and forwards this changed information to the second mapping unit 12. The device 100 then reads again data from the memory device 200 using the adapted voltage information VI and counts the number of raw bit errors BER.

If either perturbation reduces the number of raw bit errors BER, the adaptation unit 16 finally updates the look-up table 14 of the second mapping unit 12.

Figure 7:
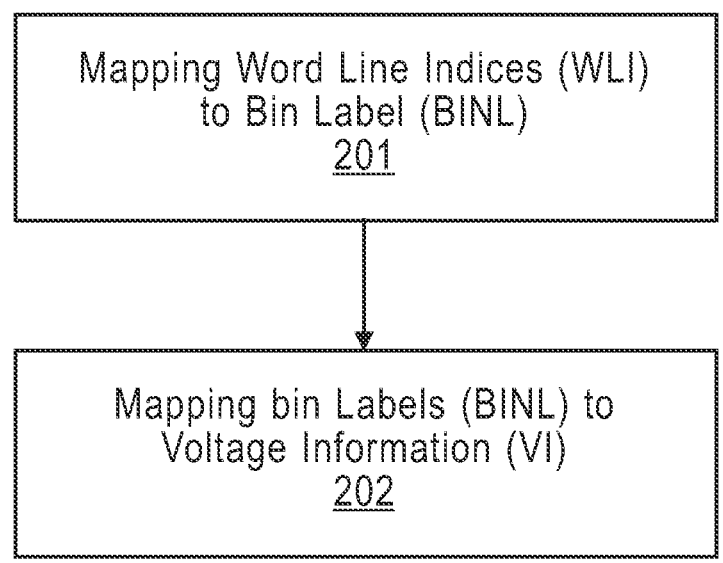
FIG. 7 shows an embodiment of a sequence of method steps for selecting a level for at least one read voltage according to an embodiment of the present invention.

Assuming that three voltages are stored per page, VB for the lower page and VA and VC for the upper page, the adaptation unit 16 optimizes in one implementation VA, VB, VC independently using 12 reads. In another implementation the number of reads can be reduced to 6 by exploiting some dependencies that exist between VA, VB, VC FIG. 7 shows an embodiment of a sequence of method steps for selecting a level for at least one read voltage RV for reading data stored in a multi-level memory device 200. The multi-level memory device 200 includes a plurality of memory blocks, wherein each of the memory blocks includes a plurality of word lines, each of the word lines being allocated to a plurality of memory pages and being indexed by a word line index WLI. A memory device 200 and a device 100 for selecting a level for a read voltage RV are shown in the above figures.

In step 201 each of the word line indices WLI is mapped to one bin label BINL. The number of bin labels BINL is smaller than the number of word lines.

In step 202, each of the bin labels BINL is mapped to a voltage information VI being indicative for at least one read voltage RV. The level for the at least one read voltage RV for reading data can then be selected for each word line based on the respective word line index WLI.

As is appreciated by one skilled in the art, aspects of the present invention can be embodied as a system, method or computer program product. Accordingly, aspects of the present invention can take the form of an entirely hardware embodiment, an entirely software embodiment (including firmware, resident software, micro-code, etc.) or an embodiment combining software and hardware aspects. Furthermore, aspects of the present invention can take the form of a computer program product embodied in one or more computer readable medium(s) having computer readable program code embodied thereon. Any combination of one or more computer readable medium(s) can be utilized. The computer readable medium can be a computer readable signal medium or a computer readable storage medium. A computer readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium can be any tangible medium that can contain, or store a program for use by or in connection with an instruction execution system, apparatus, or device.

A computer readable signal medium can include a propagated data signal with computer readable program code embodied therein, for example, in baseband or as part of a carrier wave. Such a propagated signal can take any of a variety of forms, including, but not limited to, electromagnetic, optical, or any suitable combination thereof. A computer readable signal medium can be any computer readable medium that is not a computer readable storage medium and that can communicate, propagate, or transport a program for use by or in connection with an instruction execution system, apparatus, or device. Program code embodied on a computer readable medium can be transmitted using any appropriate medium, including but not limited to wireless, wireline, optical fiber cable, RF, etc., or any suitable combination of the foregoing.

Computer program code for carrying out operations for aspects of the present invention can be written in any combination of one or more programming languages, including an object oriented programming language such as Java, Smalltalk, C++ or the like and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams can be implemented by one or more computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions can also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams can represent a module, segment, or portion of code, which includes one or more executable instructions for implementing the specified logical function(s). It should also be noted that, in some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved and algorithm optimization. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

More generally, while the present invention has been described with reference to certain embodiments, it will be understood by those skilled in the art that various changes can be made and equivalents can be substituted without departing from the scope of the present invention. In addition, many modifications can be made to adapt a particular situation to the teachings of the present invention without departing from its scope. Therefore, it is intended that the present invention not be limited to the particular embodiments disclosed, but that the present invention will include all embodiments falling within the scope of the appended claims.

We claim:

1. A device for selecting a level for at least one read voltage for reading data stored in a multi-level memory device:
    wherein the multi-level memory device includes a plurality of memory blocks;

wherein each of the plurality of memory blocks includes a plurality of word lines; and wherein each of the word lines is allocated to a plurality of memory pages and is indexed by a word line index, the device comprising:

a first mapping unit for mapping each of the word line indices to one bin label, wherein the number of bin labels is smaller than the number of word lines; and a second mapping unit for mapping each of the bin labels to a voltage information being indicative for at least one read voltage, wherein the level for the at least one read voltage for reading data is selectable for each word line based on the respective word line index.

2. The device according to claim 1, wherein the second mapping unit includes a look-up table in which a plurality of bin labels is allocated to a plurality of voltage information.

3. The device according to claim 1, wherein the voltage information includes at least one read voltage value or a delta value for increasing or decreasing an actual read voltage value.

4. The device according to claim 1, wherein the first mapping unit includes a look-up table, in which a plurality of bin labels is allocated to a plurality of word line indices.

5. The device according to claim 4, wherein the first mapping unit is adapted to map a plurality of word line indices to the same bin label.

6. The device according to claim 1, wherein a meta-data for each word line includes information indicative for an actual cycle count (PEC).

7. The device according to claim 6:
wherein the second mapping unit includes a look-up table; and
wherein the voltage information is further mapped to a plurality of cycle counts (PEC).

8. The device according to claim 6, further comprising:
a determination unit for determining an actual bit error rate when reading a word line, for comparing the determined actual bit error rate with a threshold, and for selecting the bin label based on the result of the comparison.

9. The device according to claim 8, wherein the determination unit is adapted to:
increase the bin label if the determined actual bit error rate is above the threshold; and
maintain the bin label if the determined actual bit error rate is equal to or below the threshold.

10. The device according to claim 9, wherein the determination unit is adapted to output a fail signal if the increased bin label is above a maximum number of bin labels.

11. The device according to claim 2, further comprising:
an adaptation unit for determining a raw bit error when reading a word line with the corresponding voltage information and for adapting the corresponding voltage information based on the determined raw bit error.

12. The device according to claim 11, wherein the adaptation unit is configured, during the adaptation of the corresponding voltage information, to change the voltage information and to determine the raw bit error when using the changed voltage information.

13. A memory system, comprising:
a multi-level memory device including a plurality of memory chips for storing data; and
a device for selecting a level for at least one read voltage for reading data stored on the multi-level memory device, wherein the device comprises:
a first mapping unit for mapping each of a word line indices to one bin label, wherein the number of bin labels is smaller than the number of word lines; and
a second mapping unit for mapping each of the bin labels to a voltage information being indicative for at least one read voltage, wherein the level for the at least one read voltage for reading data is selectable for each of the word lines based on a respective word line index.

14. The memory system according to claim 13:
wherein the multi-level memory device includes a plurality of memory blocks;
wherein each of the plurality of memory blocks includes a plurality of word lines; and
wherein each of the word lines is allocated to a plurality of memory pages and is indexed by the word line index.

15. The memory system according to claim 13, wherein the second mapping unit includes a look-up table in which a plurality of bin labels is allocated to a plurality of voltage information.

16. The memory system according to claim 13, wherein the voltage information includes at least one read voltage value or a delta value for increasing or decreasing an actual read voltage value.

17. The memory system according to claim 13, wherein the first mapping unit includes a look-up table, in which a plurality of bin labels is allocated to a plurality of word line indices.

18. The memory system according to claim 17, wherein the first mapping unit is adapted to map a plurality of word line indices to the same bin label.

19. A method for selecting a level for at least one read voltage for reading data stored in a multi-level memory device, the multi-level memory device including:
a plurality of memory blocks, wherein each of the memory blocks includes a plurality of word lines, and wherein each of the word lines is allocated to a plurality of memory pages and is indexed by a word line index, the method comprising:
mapping each of the word line indices (WLI) to one bin label (BINL), wherein the number of bin labels (BINL) is smaller than the number of word lines, and
mapping each of the bin labels (BINL) to a voltage information (VI) being indicative for at least one read voltage (RV), wherein the level for the at least one read voltage (RV) for reading data is selectable for each word line based on the respective word line index (WLI).

20. A non-transitory computer readable storage medium tangibly embodying a computer readable program code having computer readable instructions which, when implemented, cause a computer device to carry out the steps of the method according to claim 19.

* * * * *